United States Patent [19]

Blanchet-Fincher

[11] Patent Number: 5,288,528

[45] Date of Patent: * Feb. 22, 1994

[54] PROCESS FOR PRODUCING THIN POLYMER FILM BY PULSED LASER EVAPORATION

[75] Inventor: Graciela B. Blanchet-Fincher, Wilmington, Del.

[73] Assignee: E. I. Du Pont de Nemours and Company, Wilmington, Del.

[*] Notice: The portion of the term of this patent subsequent to Mar. 9, 2010 has been disclaimed.

[21] Appl. No.: 12,223

[22] Filed: Feb. 2, 1993

[51] Int. Cl.$^5$ .............................................. B05D 3/06
[52] U.S. Cl. ................................... 427/596; 427/255.1; 427/255.6; 427/294; 427/302; 427/314
[58] Field of Search ............ 427/596, 302, 585, 255.1, 427/255.6, 294, 314

[56] References Cited

U.S. PATENT DOCUMENTS

| | | | |
|---|---|---|---|
| 3,479,185 | 11/1969 | Chambers | 96/84 |
| 3,549,367 | 12/1970 | Chang et al. | 96/35.1 |
| 3,652,275 | 3/1972 | Baum et al. | 96/48 |
| 3,784,557 | 1/1974 | Cescon | 260/309 |
| 4,241,112 | 12/1980 | Kostandov | 427/302 X |
| 4,915,981 | 4/1990 | Traskos et al. | 427/53.1 |
| 5,192,590 | 3/1993 | Blanchet-Fincher | 427/596 |

OTHER PUBLICATIONS

Textbook of Polymer Science, John Wiley & Sons, pp. 49–50 and 141–143 (1984).
Mihailov et al., J. Appl. Phys. 69 (7), pp. 4092–4102 (1991).
Dijkkamp et al., Appl. Phys. Lett. 51 (8), pp. 619–621 (1987).
Rimai et al., Appl. Phys. Lett. 59 (18), pp. 2266–2268 (1991).
Znotins, Solid State Technology, pp. 99–104 (1986).

Primary Examiner—Bernard Pianalto

[57] ABSTRACT

This invention provides an improved process for producing a thin film of addition polymer on a substrate by laser ablation wherein the molecular weight of addition polymer is controlled by conducting the process in the presence of at least one additive selected from chain transfer agents or polymer initiators.

12 Claims, 1 Drawing Sheet

PROCESS FOR PRODUCING THIN POLYMER FILM BY PULSED LASER EVAPORATION

This invention relates to an improved process for producing thin film of addition polymers by laser ablation wherein the molecular weight of addition polymer is controlled.

The technique of laser evaporation, known in the art as laser ablation, has been applied to a large class of materials ranging from polymers to semiconductors and dielectrics. This technique has been applied extensively to form thin films of inorganic material, such as ceramic oxides exhibiting superconductivity, to fill the demands of the electronics industry for device applications such as radio frequency and microwave technology. Oriented silicon carbide films by laser ablation of silicon carbide targets are also known, but the resulting films often contain material other than silicon carbide. A method for producing stoichiometric films of inorganic oxide, nitride and carbide by irradiating a target by a laser and depositing the clusters so formed onto a substrate to form a thin film, wherein plasma is generated synchronously with the laser irradiation has also been disclosed.

Laser ablation applied to organic materials, particularly polymers, has been confined primarily to etching, i.e., selective removal of polymeric material from a polymeric target to form a patterned surface on the target. For example, the photoetching of polyimide and laser ablation of fluoropolymer composite laminates to render the laminates absorptive to ultra violet radiation have been described. A copending, commonly assigned U.S. patent application Ser. No. 07/916,663, filed Jul. 22, 1992, describes a method for producing thin films of polymers that can be synthesized by addition polymerization by irradiating a target with a laser and depositing the clusters so formed onto a substrate to form a thin film, wherein plasma is generated synchronously with the laser irradiation.

Thin films of polymers, such as fluoropolymers, are used as coatings in a variety of applications due to their antistatic or abrasion resistant properties. Others such as acrylates are widely used in electronics for high resolution patterning applications. The properties of such thin films such as hardness or abrasion resistance are influenced by their molecular weight. Thus a means of depositing films wherein the molecular weight can be precisely controlled is desirable because it provides a means of controlling the properties of the films to optimize them for their desired ultimate use. The present invention provides such a process.

SUMMARY OF THE INVENTION

This invention comprises an improved process for producing a thin film of addition polymer on a substrate by laser ablation of a target polymer wherein the molecular weight of addition polymer is controlled. In a process for producing a thin film of an addition polymer on a substrate by bombarding a target polymer with radiation from a pulsed laser in a vacuum or gas atmosphere to form a plume of the components of the target polymer which undergo a repolymerization reaction and are deposited on the substrate as a film, the improvement comprises modifying the molecular weight of the addition polymer of the deposited film by conducting the deposition in the presence of at least one additive comprising a chain transfer agent or polymer initiator. The substrate can be coated with the additive or the additive can be introduced into the atmosphere of the reaction.

BRIEF DESCRIPTION OF THE DRAWINGS

The FIGURE is a schematic view of an apparatus useful in the practice of this invention.

DETAILED DESCRIPTION OF THE INVENTION

Figure 1:
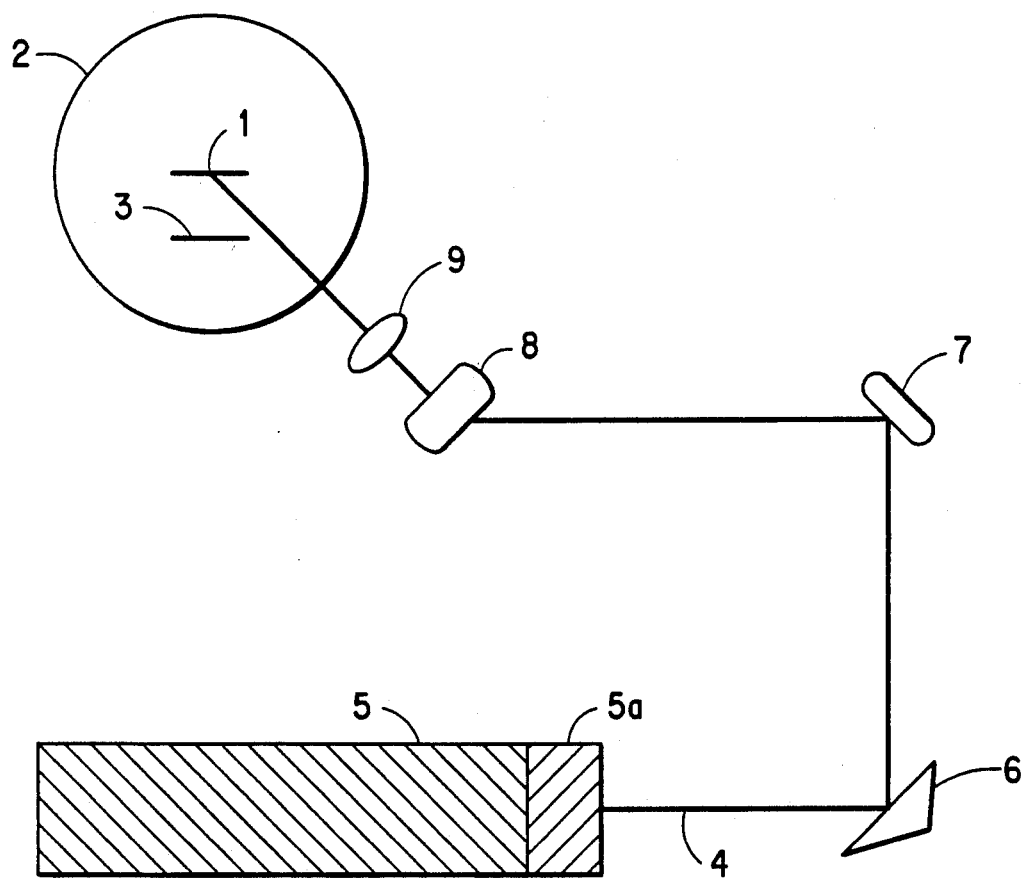

The present invention comprises an improved process for producing a thin film of addition polymer on a substrate by laser ablation of a target polymer wherein the molecular weight of the polymer of the deposited film is controlled. By conducting the deposition in the presence of one or more additives comprising a chain transfer reagent or polymer initiator, the molecular weight of the deposited film is modified.

While this invention is not limited by any particular theory or explanation of operation, it is believed that addition polymer removal occurs via a thermal process in which photoabsorption rapidly heats the organic molecules to elevated temperatures causing bond cleavage and the onset of the decomposition of the polymer chains. Since the lower molecular weight products have a larger specific volume than the original sample, material is ejected explosively to form a plume. This plume is believed to be composed of predominantly monomer and radicals. For example, when polytetrafluoroethylene or tetrafluoroethylene copolymer is the target, $CF_2^-$ and $C_2F_4^-$ radicals, as well as other low molecular weight products in an excited state may be present in the plume. However, the plume could also include higher molecular weight products up to and including the original sample material itself. The ejected monomer and other radicals in the presence of gases of choice, repolymerize on the substrate forming a thin film with preferably the stoichiometry of the starting material.

The presence of a chain transfer reagent, polymer initiator, or both during film deposition enhances the repolymerization reaction. The polymer initiator is employed to create radicals, or increase the number of radicals, in the plume created during laser ablation. Electrons from an initiator can be transferred to a chain transfer reagent, typically a smaller highly mobile molecule, which reacts with the monomers present to begin or enhance a chain repolymerization reaction.

The target materials used in the practice of this invention are addition polymers. Addition polymers are polymers which are formed by radical chain polymerization, i.e., free-radical polymerization as described in Textbook of Polymer Science, John Wiley & Sons, pp. 49–50 (1984). Typical addition polymers are formed from monomers containing at least one ethylenically unsaturated bond. Included within the definition of addition polymers are fluoropolymers, alkylacrylic polymers, and ethylene polymers such as polyethylene.

With the exception of ethylene polymers such as polyethylene, suitable target addition polymers will thermally depolymerize to regenerate the monomer or monomers from which they were made to various degrees. The degree of regenerating is preferably at least 70%, more preferably at least 80%, and most preferably at least 90% by weight of the monomer or monomers from which it was made, based on the mole % of the addition polymer. Optionally, but not necessarily, the thermally formed monomer or monomers can reform the original addition polymer upon cooling.

Thermal depolymerization is heating a polymer until it vaporizes into various components as well as decomposition products, see Textbook of Polymer Science, pp. 141-143, John Wiley & Sons (1984).

Addition polymers of choice are formed by free radical polymerization of their monomeric precursor or precursors at the substrate temperatures used in the practice of the process of this invention.

Fluoropolymers suitable for use in the present invention as target polymers are generally those polymers having a carbon backbone and fluorine substituents thereon, said fluorine substituents constituting at least 40% by weight of the polymer. Examples include repeat units of the formulas I or II

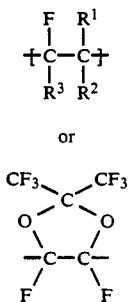

wherein $R^1$, $R^2$, and $R^3$ are independently selected from fluorine, hydrogen, chlorine, branched or straight chain alkyl or fluoroalkyl of up to 10 carbon atoms, branched or straight chain alkoxy or fluoroalkoxy of up to 10 carbon atoms, branched or straight chain vinylether or fluorovinyl ether of up to 10 carbon atoms or ethylene copolymers thereof, and copolymers with the above repeat units. Preferred fluoropolymers are fluorinated polyethylenes particularly polytetrafluoroethylene; or compounds of Formula I, where $R^1$, $R^2$, or $R^3$ is perfluoromethyl; or compounds of Formula I where $R^1$, $R^2$, or $R^3$ is perfluoropropylvinylether. Preferred copolymers are TEFLON AF 1600® (a copolymer of polytetrafluoroethylene and perfluoro-2,2-dimethyl-1,3-dioxol), TEFLON AF 1601® (a copolymer of polytetrafluoroethylene and bis-2,2-trifluoromethyl-4,5-difluoro-1,3-dioxole), TEFLON FEP® (a copolymer of hexafluoropropylene and polytetrafluoroethylene), and TEFLON PFA® (a copolymer of perfluoroalkoxy monomers and tetrafluoroethylene), each available from E. I. du Pont de Nemours and Company, Wilmington, Del., U.S. Alkylacrylic polymers suitable for use herein include those having an alkyl group of 1 to 20 carbon atoms, such as alkylmethacrylic polymers, and copolymers thereof. Preferred alkylacrylic polymers are poly(methylmethacrylate), poly(ethylmethacrylate) and poly(butylmethacrylate).

It is preferred that the target be as dense as possible consistent with the density achievable by the method of preparation to insure structural integrity of the target. Adequate densities are available commercially. The most convenient form of the target is that of a pellet or disk. If the pellet or disk form is not readily commercially available, polymer pellets or disks can be easily made by pressing commercially available powdered polymer at high pressure, e.g., about $172 \times 10^6$ Pascals and, optionally high temperature, e.g., about 100° C. above the polymer glass transition temperature or within about 30° C. of the crystalline melting temperature. Typical disk size is 2 cm in diameter and 4 mm thick.

The practice of this invention is further illustrated in reference to FIG. 1. The target addition polymer 1, is placed in a vacuum chamber 2 typically 3 cm to 5 cm from the substrate 3 upon which the film is to be deposited. A wide variety of substrates are useful in the present invention, the major requirement being that the substrate can withstand the temperatures and pressures of operation. Typical substrates are glass, quartz, potassium bromide, metals and silica. The addition polymer can also be deposited on porous silver, oriented and unoriented polyethylene and filter paper for membrane applications. The UV laser beam 4 of a pulsed laser 5 is then transmitted through a plane mirror 7, rastering mirror 8 and lens 9 onto the target addition polymer 1 with a fluence of preferably from about 0.10 to about 3 Joules/cm²-pulse, and more preferably for fluoropolymers at least about 0.4 Joules/cm²-pulse to about 1.5 Joules/cm²-pulse; for alkylacrylic polymers at least 0.1 Joules/cm²-pulse to about 0.5 Joules/cm²-pulse; and for polyethylene at least 0.4 Joules/cm²-pulse to about 1.0 Joules/cm²-pulse. Typical lasers useful in the practice of this invention are a Nd-YAG laser at wavelength 266 nm, fourth harmonic beam thereof, such as Spectra-Physics DCR-11, available from Spectra-Physics, 1250 W. Middlefield Road, P.O. Box 7013, Mountain View, Calif., U.S. 94039-7013, and KrF or ArF excimer lasers at wavelengths of 248 nm and 193 nm respectively, such as the Lambda Physik EMG 202. When a Nd-YAG laser is used, a harmonic generator 5a and a pellin-broca 6 prism are incorporated into the path as shown in FIG. 1 to generate a UV beam and separate it from the fundamental and second harmonic, respectively. The bombardment of the laser beam 4 on the target addition polymer results in immediate ablation and expulsion of components of said addition polymer, such as the monomer and/or lower molecular weight compositions or fragments of the addition polymer from the target into a plume. The plume components usually undergo a repolymerization reaction and are deposited on the substrate in the form of a film at the rate of about 0.005 to about 0.1 nanometers 1/pulse.

In accordance with this invention the molecular weight of the addition polymer film formed by laser ablation can be varied by incorporating initiators and/or chain transfer agents either directly into the gas atmosphere in the deposition chamber or by applying them as a coating onto the substrate prior to the films fabrication. The substrate temperature and partial pressure of the gaseous atmosphere also can influence the molecular weight.

Addition polymers can range in structure from crystalline, such as many of the fluoropolymers, to highly amorphous, such as many of the alkylacrylic polymers. While most addition polymers have both a glass transition temperature, $T_g$, and a crystalline melting temperature, $T_m$, the highly crystalline addition polymers are commonly characterized by $T_m$. Whereas with highly amorphous polymers, no crystalline transition occurs, so amorphous polymers are characterized by $T_g$. Generally, in highly crystalline polymers ablation is preferably conducted about 20° C. to about 40° C. below $T_m$ while in amorphous polymers ablation is preferably conducted about 50° C. to about 100° C. above $T_g$. Molecular weight is varied by operating at various temperatures below the $T_g$ and/or $T_m$.

The substrate for fluoropolymers is generally maintained at a temperature about 75° C. below the crystalline melting temperature of the fluoropolymer, preferably about 50° C. below the crystalline melting temperature of the fluoropolymer, and most preferably about 25° C. below the crystalline melting temperature of the fluoropolymer. For alkylacrylic polymers and polyethylene, the substrate is maintained at a temperature about 100° C. above the glass transition temperature of the polymer, preferably about 75° C. above the glass transition temperature of the polymer and most preferably about 50° C. above the glass transition temperature of the polymer.

The ablation is preferably conducted in a gas atmosphere, although vacuum deposition is also possible. The preferred atmospheres are argon and fluorocarbon gases. In accordance with this invention, the pressure is maintained below about 33.3 Pascals, preferably below about 6.66 Pascals, and most preferably below about 3.33 Pascals. The molecular weight of the resulting film can be significantly raised by operating at pressures lower than about 33.3 Pascals. When fluorocarbon gases are used, it is possible that some fluorocarbon radicals may be formed from the fluorocarbon gas per se and act to further fluorinate the film formed when a fluoropolymer is used as the target.

A wide variety of initiators incorporated into the gas environment or coated on the substrates are useful in the present invention. Preferred initiators are the hexaarylbiimidazole photoinitiators, 2,2',4,4',5,5'-hexaarylbiimidazoles, sometimes called 2,4,5-triarylimidazolyl dimers, which dissociate on exposure to actinic radiation to form the corresponding triarylimidaozlyl free radicals. Such photoinitiators are disclosed in a number of patents. These include Cescon U.S. Pat. No. 3,784,557; Chambers U.S. Pat. No. 3,479,185; U.S. Pat. No. 3,549,367 of Chang et al.; and U.S. Pat. No. 3,652,275 of Baum et al.; the disclosures of each are hereby incorporated herein by reference.

The hexaarylbiimidazoles can be represented by the formula III

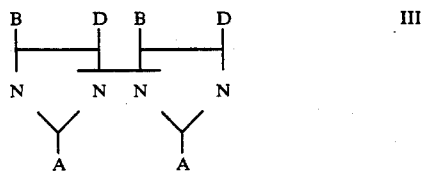

wherein A, B and D represent aryl groups which can be the same or different, carbocyclic or heterocyclic, unsubstituted or substituted with substituents that do not interfere with the dissociation of the hexaarylbiimidazole to the triarylimidazolyl radical, and each dotted circle stands for four delocalized electrons (i.e., two conjugated double bonds) which satisfy the valences of the carbon and nitrogen atoms of the imidazolyl ring. The B and D aryl groups can each be substituted with 0-3 substituents and the A aryl groups can be substituted with 0-4 substituents.

The aryl groups include one- and two-ring aryls, such as phenyl, biphenyl, naphthyl, pyridyl, furyl and thienyl. Suitable substituents on the aryl groups can be halogen, cyano, lower hydrocarbyl (including alkyl, halo alkyl, cyanoalkyl, hydroxyalkyl and aryl), lower alkoxy, aryloxy, lower alkylthio, arylthio, sulfo, alkyl sulfonyl, arylsulfonyl, and nitro, and lower alkylcarbonyl. In the foregoing list, alkyl groups referred to therein are preferably of one to six carbon atoms; while aryl groups referred to therein are preferably of six to 10 carbon atoms. Preferred hexaarylbiimidazoles include 2,2',4,4'-tetrakis(o-chlorophenyl)-5,5'-bis(m,p-dimethoxyphenyl)biimidazole; 2,2'-bis(o-chlorophenyl)-4,4',5,5'-tetraphenylbiimidazole; and 2,2'-bis(o-chlorophenyl)-4,4',5,5'-tetrakis(m-methoxyphenyl)biimidazole.

Initiators other than hexaarylbiimidazoles may also be used. Representative alternative initiators may include perfluoropropyl peroxide, perfluorobutyl peroxide, hexafluoropropylene oxide oligomer peroxide, benzoic peroxide and azo-bis-isobutylnitride.

The initiator is incorporated into the system either by coating the substrate after dissolving it in appropriate solvents such as methylene chloride or methyl ethyl ketone, or its vapor incorporated through a needle valve connected to a evacuated vessel containing the initiator in its powder form. The initiator on exposure to activating light radiation, such as ultraviolet light, dissociates to form radicals which are stable in the presence of the radiation. These radicals assist in initiating the growth of polymer chains. Generally, the more active the initiator, evident by an increase in the number of radicals present, the higher will be the molecular weight of the polymer in the resulting film. Upon removal of the radiation the radicals dimerize and reform the initiator.

Any chain transfer agent identified in the prior patents for use with hexaarylbiimidazoles initiated photopolymerizable systems can be used. For example, U.S. Pat. No. 3,652,275 of Baum et al. lists N-phenylglycine; 1,1-dimethyl-3,5-diketocyclohexane and organic thiols, such as 2-mercaptobenzothiazole; 2-mercaptobenzoxazole; 2-mercaptobenzimidazole; pentaerithritol tetrakis (mercaptoacetate); 4-acetamidothiophenol; mercaptosuccinic acid; dodecanethiol; and beta-mercaptoethanol. Others that can be used include various tertiary amines known in the art, 2-mercaptoethane sulfonic acid; 1-phenyl-4H-tetrazole-5-thiol; 6-mercaptopurine monohydrate; bis-(5-mercapto-1,3,4-thiodiazol-2-yl; 2 mercapto-5-nitrobenzimidazole; and 2-mercapto-4-sulfo-6-chlorochlorobenzoxazole. The preferred chain transfer agents for acrylates and methacrylates depositions are 2-mercaptobenzoxazole and 2-mercaptobenzimidazole.

Fluoropolymers have long been known in the art for their antistatic and/or abrasion resistant properties and, as such, are useful as coatings for a variety of applications requiring these properties. Where ultrathin coatings are desired, such as coating surgical implants to reduce friction and render them abrasion resistant, coatings of thin fluoropolymer film prepared in a manner that retains the original composition/structure of the fluoropolymer, are especially useful. The process of the present invention is useful to create thin film fluoropolymers of specific molecular weight.

Polyethylene, being a non-polar polymer, has similar uses to those of polytetrafluoroethylene. Acrylates have been widely used in electronics for high resolution patterning, and the acrylate coatings obtained by the present invention can have the same utility.

The molecular weight of polymers can be determined by chemical or physical methods. With the exception of some type of end-group analysis all methods of molecular weight analysis require solubility of the polymer and, as a result, the molecular weight of polytetrafluoroethylene films could not be determined. Gel permeation chromatography was used to measure the distribution of chain lengths in the films fabricated by laser ablation since it is an accurate widely use separation method for high polymers. The separation takes place in a chromatographic column filed with beads of a porous rigid gel. The pores in the gel are of the same size as the polymer molecules. A sample of a dilute solution is introduced. As the material flows through the beads they diffuse into the internal structure of the gel according to the size of the polymer molecules. The larger molecules spend less time inside the gel and flow through the column. The different species are eluted from the column in order of their molecular size, the largest emerging first. The columns are calibrated with known narrow distribution commercial polymers in terms of molecular size parameter. Gel permeation chromatography is extremely valuable since the method can be applied to a variety of polymers.

Because of the existence of a distribution in a finite sample is an experimental measurement an average number ($M_n$) molecular weight is obtained. For typical polymers the number average lies near the peak of the molecular weight distribution. For example, if M is the mass of molecules of a given chain length, N is the number of molecules of a given chain length, i is the number of different chain lengths, and a sample contains $N_i$ molecules, then $\Sigma\ N_i$ represents the total number of molecules. The number average molecular weight is $$M_n = \frac{\Sigma\ N_i M_i}{\Sigma\ N_i}$$

After $M_n$, the next higher average molecular weight is the weight-average molecular weight, $M_w$ defined so that each molecule contributes in proportion to the square of its mass. This quantity is defined as:

$$M_w = \frac{\Sigma\ N_i M_i^2}{\Sigma\ N_i M_i}$$

The quantity $M_w/M_n$ is a useful measure of the breath of the molecular weight distribution and is often quoted to describe this feature.

EXAMPLES 1-8

These examples demonstrate the effect of temperature on the molecular weight of the thin films fabricated by laser ablation. Eight polymethylmethacrylate films were deposited onto a glass by ablating a target of high molecular weight commercial polymethylmethacrylate, Elvacite® 2051, available from E. I. du Pont de Nemours and Company, Wilmington, Del., U.S., in an argon atmosphere. The ablation target was prepared by pressing 3 grams of Elvacite® 2051 in a ¾" dye at $6.89 \times 10^7$ Pascals at 180° C. for 10 minutes and allowed to cool to ambient temperature under pressure. Laser ablation was performed in a vacuum chamber at a background pressure of $1.33 \times 10^{-4}$ Pascals. The chamber was equipped with quartz windows to permit the transmission of a ultraviolet laser beam onto the target positioned at the center of the chamber. The laser beam angle of incidence was 45°. The target was ablated with the 266 nm 4th harmonic line of a Spectra-Physics DCR-11 Nd-YAG laser. The fourth harmonic and second harmonic lines were generated by pairs of dichroic mirrors at 45° incidence placed immediately outside the laser cavity. The overlapping fundamental, first harmonic and second harmonic lines were separated by a UV grade fused silica Pellin Broca prism placed about 12.7 cm away from the harmonic generation assembly. The beam was directed into the chamber by plane mirrors and focused into a 2 mm² spot by a lens placed at the entrance of the vacuum chamber. Uniform coverage of the substrate was assured by rastering the laser beam with a set of motorized micrometers placed on the last mirror mount. The fluence of the laser beam was maintained at 0.3 Joules/cm² in a 6-7 nanosecond pulse. The thin films were deposited onto a $25 \times 25$-mm glass positioned 3-cm away from the target in the normal direction. The substrate temperature during deposition was varied from $-100°$ C. to 225° C. and the argon pressure was maintained at 33.3 Pascals. Following the 15 minutes deposition, argon was bled into the chamber until atmospheric pressure was reached. The films were removed from the glass substrate, dissolved in 1 ml of tetrahydrofuran and injected into the chromatography column. The weight average molecular weights and the deposition temperatures are listed below.

TABLE 1

| Example No. | Deposition Temperature (°C.) | $M_w$ |
|---|---|---|
| 1 | $-100$ | 10,500 |
| 2 | 20 | 10,000 |
| 3 | 75 | 18,100 |
| 4 | 125 | 21,500 |
| 5 | 150 | 40,600 |
| 6 | 175 | 60,031 |
| 7 | 200 | 104,000 |
| 8 | 225 | 138,000 |

EXAMPLES 9-12

These examples demonstrate the effect of background pressure on the molecular weight of the laser ablated films. The target and deposition procedure were otherwise as described in Examples 1-8. The laser power used during the deposition was 0.4 Joules/cm². The films in the examples number 9 and 11 in Table 2 were deposited in vacuum at a background pressure of $2.66 \times 10^{-3}$ Pascals. In contrast, the films labeled 10 and 12 in Table 2 were deposited with an argon background pressure maintained at 33.3 Pascals. After deposition was completed the films were scraped, dissolved in tetrahydrofuran and injected into the chromatography column for molecular weight determination. The molecular weight of the films was determined as specified above.

TABLE 2

| Example No. | Deposition Pressure (Pascals) | Deposition Temperature | $M_w$ | $M_w/M_n$ |
|---|---|---|---|---|
| 9 | $2.67 \times 10^{-3}$ | ambient | 27,800 | 4.28 |
| 10 | 33.3 | ambient | 10,000 | 2.23 |
| 11 | $2.67 \times 10^{-3}$ | 175 | 325,000 | 2.34 |
| 12 | 33.3 | 175 | 58,100 | 4.40 |

EXAMPLES 13-16

Four polymethylmethacrylate films were deposited onto microscope slides coated with a solution of the initiators listed below in Table 3 in methylene chloride. The solvent was evaporated prior to the fabrication of the thin films. The substrate temperature of the films was held at 175° C. throughout the film fabrication. The target preparation and deposition procedure were otherwise as described in Examples 1-8. The $M_w$ values obtained from gel permeation chromatography as described in the previous examples are listed below.

TABLE 3

| Example No. | I* | $M_w$ |
| --- | --- | --- |
| 13 | $I_1$ | 243,000 |
| 14 | $I_2$ | 50,500 |
| 15 | $I_3$ | 14,300 |
| 16 | $I_4$ | 50,400 |

*where I is an initiator
$I_1$ is 2,2',4,4'-tetrakis(o-chlorophenyl)-5,5'-bis(m,p-dimethoxyphenyl)biimidazole
$I_2$ is 2,2'-bis(o-chlorophenyl)-4,5,5'-5,5'-tetraphenylbiimidazole
$I_3$ is Benzoic Peroxide
$I_4$ is Azo-bisisobutrylnitride (VAZO 64)

EXAMPLES 17-18

Two polymethylmethacrylate films were deposited onto microscope slides coated a solution of the chain transfer agents listed below in Table 4 in methylene chloride. The solvent was evaporated prior to the fabrication of the thin films. The ablation target was prepared as described in Examples 1-8. The films were deposited at 175° C. After deposition was completed the films were scraped, dissolved in tetrahydrofuran and injected into the chromatography column for molecular weight determination. The $M_w$ values are listed below.

TABLE 4

| Example No. | CTA* | $M_w$ |
| --- | --- | --- |
| 17 | CTA1 | 249,000 |
| 18 | CTA2 | 447,000 |

*where CTA is chain transfer agent
CTA1 is 2-mercaptobenzoxazole
CTA2 is 2-mercaptobenziimidazole

EXAMPLES 19-20

Two polymethylmethacrylate films were deposited onto microscope slides coated with a solution of initiator and chain transfer agents listed below in methylene chloride. The solvent was evaporated prior to the fabrication of the thin films. The substrate temperature was held at 175° C. during film fabrication. The preparation of the ablation target and deposition parameters were as specified in Examples 1-8. After deposition was completed the films were scraped, dissolved in tetrahydrofuran and injected into the chromatography column for molecular weight determination. The $M_w$ values are listed below.

TABLE 5

| Example No. | Td* (°C.) | I + CTA** | $M_w$ |
| --- | --- | --- | --- |
| 19 | 175 | $I_1$ + CTA1 | 74,400 |
| 20 | 175 | $I_2$ + CTA1 | 53,700 |

*Temperature of deposition
**CTA1 is 2-mercaptobenzoxazole
$I_1$ is 2,2',4,4'-tetrakis(o-chlorophenyl)-5,5'-bis(m,p-dimethoxyphenyl)biimidazole
$I_2$ is 2,2'-bis(o-chlorophenyl)-4,5'-5,5'-tetraphenylbiimidazole

EXAMPLES 21-22

Two TEFLON AF 1600® films were deposited onto microscope slides coated with a solution of 2-mercaptobenzoxazole, the chain transfer agent listed below, in methylene chloride. The solvent was evaporated prior to the fabrication of the thin films. The ablation target was prepared by pressing 3 g of TEFLON AF 1600® in a ¾" dye at 10,000 PSI at 210° C. for 10 min. and allowed to cool to ambient temperature under pressure. Films were deposited at 1 J/cm² laser fluence in an argon atmosphere of 26.66 Pascals. After deposition was completed the films were scraped, dissolved in FC-75, a $C_8F_{16}O$ cyclic ether mixture containing perfluoro-2-n-butyl-tetrahydrofuran, available from 3M Company, Minneapolis, Minn., U.S., and injected into the chromatography column for molecular weight determination. The $M_w$ values are listed below.

TABLE 6

| Example No. | Td* (°C.) | CTA** | $M_w$ | $M_n$ |
| --- | --- | --- | --- | --- |
| 21 | 175 | — | 204,000 | 52,200 |
| 22 | 175 | CTA1 | 226,700 | 65,700 |

*Temperature of deposition
**CTA1 is 2-mercaptobenzoxazole

What is claimed is:

1. In a process for producing a thin film of an addition polymer on a substrate by bombarding a target polymer with radiation from a pulsed laser in a vacuum or gas atmosphere to form a plume of the components of the target polymer which undergo a repolymerization reaction and are deposited on the substrate as a film, wherein the improvement comprises modifying the molecular weight of the addition polymer of the deposited film by conducting the deposition in the presence of at least one additive comprising a chain transfer agent or polymer initiator.

2. The process of claim 1 wherein the additive is coated on the substrate prior to deposition.

3. The process of claim 1 wherein the additive is introduced as a gas into the atmosphere of the repolymerization.

4. The process of claim 1 wherein the chain transfer agent is a mercaptan.

5. The process of claim 4 wherein the chain transfer agent is 2-mercaptobenzoxazole, 2-mercaptobenzimidazole, butyl mercaptan, bromotrichloromercaptan, chloroform, or cyclohexane.

6. The process of claim 1 wherein the initiator is a hexaarylbiimidazole.

7. The process of claim 1 wherein the initiator is 2,2',4,4'-tetrakis(o-chlorophenyl)-5,5'-bis(m,p-dimethoxyphenyl)biimidazole; 2,2'-bis(o-cholorphenyl)-4,4',5,5'-tetraphenylbiimidazole; 2,2'-bis(o-chlorophenyl)-4,4',5,5'-tetrakis(m-methoxyphenyl)-biimidazole; perfluoropropyl peroxide; perfluorobutyl peroxide; hexafluoropropylene oxide oligomer peroxide; benzoic peroxide; or azo-bis-isobutrylnitride.

8. The process of claim 1 wherein the substrate is maintained at a temperature about 100° C. above the glass transition temperature of the target addition polymer.

9. The process of claim 1 wherein the substrate is maintained at a temperature about 75° C. below the crystalline melting temperature of the target addition polymer.

10. The process of claim 1 wherein the pressure is maintained below about 33.3 Pascals during the deposition.

11. The process of claim 1 wherein the target polymer comprises a fluoropolymer, alkylacrylic polymer, or polyethylene.

12. The process of claim 11 wherein the target polymer comprises polymethylmethacrylate; polyethylmethacrylate; polybutylmethacrylate; polytetrafluoroethylene; a compound of Formula I wherein $R^1$, $R^2$, or $R^3$ is perfluoromethyl; a compound of Formula I wherein $R^1$, $R^2$, or $R^3$ is perfluoropropylvinylether; a copolymer of polytetrafluoroethylene and perfluoro-2,2-dimethyl-1,3-dioxol; a copolymer of polytetrafluoroethylene and bis-2,2-trifluoromethyl-4,5-difluoro-1,3-dioxole; a copolymer of polytetrafluoroethylene and hexafluoropropylene; or a copolymer of tetrafluoroethylene and perfluoroalkoxy monomer.

* * * * *